US006228197B1

(12) United States Patent
Wang

(10) Patent No.: US 6,228,197 B1
(45) Date of Patent: May 8, 2001

(54) ASSEMBLY METHOD ALLOWING EASY RE-ATTACHMENT OF LARGE AREA ELECTRONIC COMPONENTS TO A SUBSTRATE

(75) Inventor: Ge Wang, Huntington Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/256,435

(22) Filed: Feb. 23, 1999

(51) Int. Cl.$^7$ ....................................... B32B 35/00
(52) U.S. Cl. ............... 156/94; 156/152; 156/344
(58) Field of Search ................ 156/64, 94, 152, 156/299, 297, 344; 438/14, 15, 17, 106, 107, 108; 29/593, 832, 762, 426.4, 402.03

(56) References Cited

U.S. PATENT DOCUMENTS

| 4,978,052 | * | 12/1990 | Fister et al. | 228/123 |
| 5,304,269 | * | 4/1994 | Jacaruso | 156/94 |
| 5,601,675 | * | 2/1997 | Hoffmeyer et al. | 156/94 |
| 5,757,073 | * | 5/1998 | Hoffmeyer | 257/700 |

* cited by examiner

Primary Examiner—Jeff H. Aftergut
Assistant Examiner—John T. Haran
(74) Attorney, Agent, or Firm—Michael S. Yatsko

(57) ABSTRACT

A method is provided for attaching electronic components (12) onto a substrate (10) which allows quick, easy and inexpensive subsequent removal and re-attaching of the electronic component (12) to obtain an undamaged printed wiring board package. The method for attaching the electronic component (12) onto the substrate (10) includes bonding a component interlayer (18) onto the electronic component (12) with a component bonding layer (16), and forming an adhesive bond (14) between the component interlayer (18) and the substrate (10). If the removal of the electronic component (12) is needed, the electronic component (12) is removed from the substrate (10) by heating the component interlayer (18), thus melting the component bonding layer (16). If the re-attachment of the electronic component (12) is needed, the method for attaching the electronic component (12) onto the substrate (10) is repeated, using a new component interlayer (18). If necessary, the substrate (10) is bonded onto a substrate interlayer (19) with a substrate bonding layer (21), and the adhesive bond (14) is formed between the component interlayer (18) and the substrate interlayer (19). The method is especially efficient for attaching large area electronic components (12) and is usable during fabrication or maintenance of PWB packages.

26 Claims, 2 Drawing Sheets

ASSEMBLY METHOD ALLOWING EASY RE-ATTACHMENT OF LARGE AREA ELECTRONIC COMPONENTS TO A SUBSTRATE

BACKGROUND OF THE INVENTION

1. Field of the Invention

This invention relates generally to a method for assembling printed wiring board packages, and more specifically pertains to a method of attaching each electronic component to a substrate through an interface, to allow easy subsequent re-attachment of the electronic component without damage.

2. Description of the Related Prior Art

High density Printed Wiring Board (PWB) packages are composed of large area electronic components, such as Surface Mount Component (SMC) modules and Multichip Module (MCM) packages. In many civilian and military applications, such as space projects, the PWB packages have to withstand violent shaking which requires that all electronic components be firmly attached to the PWB substrate of the PWB package to prevent vibration-induced damages and dampen vibrations of the electronic components.

The conventional process for attaching electronic components, such as MCM packages, onto printed wiring boards includes a step of bonding the electronic component onto the printed wiring board substrate directly, without any intermediary, performed either prior to or after the soldering of the electronic component leads to the PWB. The bonding material is typically an epoxy adhesive, such as PR 4-34-1, which has a relatively good vibration damping and thermal conduction. FIG. 1 illustrates a greatly enlarged cross-sectional view of a result of the conventional adhesive bonding. It shows a printed wiring board substrate 10 and an electronic component 12, directly attached to the printed wiring board substrate 10 with an adhesive 14, having its electrical leads 16 soldered onto the printed wiring board substrate 10.

Although sufficient for small electronic components, the conventional bonding method can be difficult for attachment of large area MCMs. Moreover, quite often an electronic component has to be replaced or re-attached, either due to the electronic component malfunction or its redesign, and the bond has to be reworked. With the conventional process it is usually extremely hard or impossible to remove the electronic component from the PWB substrate without damage, unless the electronic component is very small and robust.

When the electronic component is large, and thus fragile, there is a considerable risk that the expensive electronic component will be damaged during rework. Once the adhesive is fully cured (solidified), it is extremely difficult to break the adhesive bond without damaging the electronic component, because an external heating machine, such as a heating gun, is used to heat and break the adhesive bond. However, due to its size, the machine heats the entire PWB package with all its electronic components and can easily cause the damage. The custom-made large area MCMs can be very expensive, and the cost of reworking these parts bears significant impact on product competitiveness.

Therefore, there is a need for an efficient process for fabrication of PWB packages, that includes an improved method for attaching and re-attaching large area electronic components onto printed wiring board substrates, at high production yield and without any degradation of their capabilities.

SUMMARY OF THE INVENTION

The preceding and other shortcomings of prior art are addressed and overcome by the preferred embodiment of the present invention, which consists of an efficient method for attaching and re-attaching large area electronic components onto a printed wiring board substrate, usable during fabrication or maintenance of PWB packages, that allows easy re-attachment of the electronic component without damage.

One embodiment of the present invention is a method for attaching electronic components onto a substrate. The method includes attaching the electronic component onto the substrate by bonding a component interlayer onto the electronic component with a component bonding layer, and forming an adhesive bond between the component interlayer and the substrate.

Another embodiment of the present invention is a method which allows quick, easy and inexpensive removal and re-attaching of the electronic component to obtain an undamaged printed wiring board package. When the removal of the electronic component is needed, the electronic component is removed from the substrate by heating the component interlayer, thus melting the component bonding layer. If the re-attachment of the electronic component is needed, the method for attaching the electronic component onto the substrate is repeated, using a new component interlayer.

If necessary, the substrate is first bonded onto a substrate interlayer with a substrate bonding layer, and the adhesive bond is formed between the component interlayer and the substrate interlayer. The adhesive bond may include a thermocouple used to determine the melting point of the component and substrate bonding layer.

The foregoing and additional features and advantages of the present invention will become further apparent from the following detailed description and accompanying drawing figures that follow. In the figures and written description, numerals indicate the various features of the invention, like numerals referring to like features, throughout for the drawing figures and the written description.

DETAILED DESCRIPTION OF THE INVENTION

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein with specificity.

The present invention preserves the steps of the conventional process for fabrication of PWB packages and improves the traditional adhesive bonding PWB package assembly operation with the introduction of an interface between each electronic component and the PWB substrate. The interface may be internally heated to allow easy rework of the PWB package without damaging the electronic components. It is especially profitable for attaching MCM and other large area components, typically having an area larger than 1 sq. in.

Figure 2:
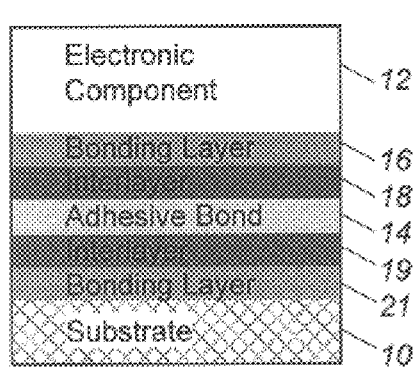
FIG. 2 illustrates a greatly enlarged cross-sectional view of a result of bonding via a multi-layer interface, in accordance with the present invention.

The substrate may be other than the PWB substrate and the interface between each electronic component and the substrate may consist either of two interlayers or of only one interlayer, if the substrate is strong enough. To perform the bonding operation according to the present invention, as shown in FIG. 2, the backside of an electronic component 12, such as an MCM, is bonded to an interlayer 18 with a bonding material 16. The bonding material 16 is preferably a low melting temperature bonding material, such as a low melting point metal solder or a thermal plastic (hot melt) adhesive which preferably has a narrow melting range. The interlayer 18 is preferably a metal sheet with a coefficient of thermal expansion (CTE) which closely matches the CTE of the electronic component 12, which may be made of metal, as in an MCM component, or ceramic material.

Figure 3:
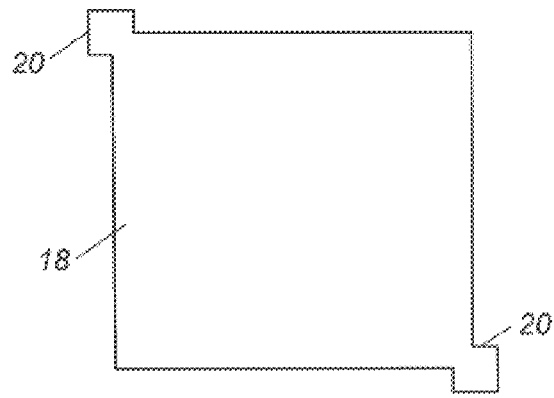
FIG. 3 illustrates a greatly enlarged top view of an interlayer, in accordance with the present invention.

Another interlayer 19 of the same type of material as the interlayer 18 is bonded on a substrate 10, where the electronic component 12 is to be attached, with a bonding layer 21 of the same or similar material as the bonding material 16. In the next step, an adhesive bond 14, preferably an epoxy adhesive PR 4-34-1, is used to bond the two interlayers, a component and substrate interlayer 18, 19 together, thus attaching the electronic component 12 onto the substrate 10. Each interlayer 18, 19 is a sheet, usually 1 mil thick, and has two protrusions 20, located on the two opposing corners of the interlayers 18, 19, as shown in FIG. 3. The adhesive bond 14 (FIG. 2) covers the protrusions 20 of the interlayers 18, 19.

Figure 1:
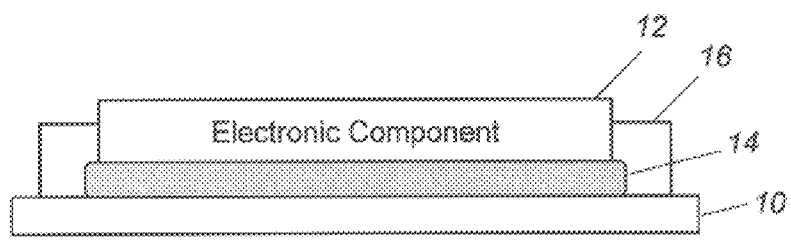
FIG. 1 illustrates a greatly enlarged cross-sectional view of a result of conventional adhesive bonding of an electronic component to a printed wiring board substrate, according to the prior art.
Figure 5:
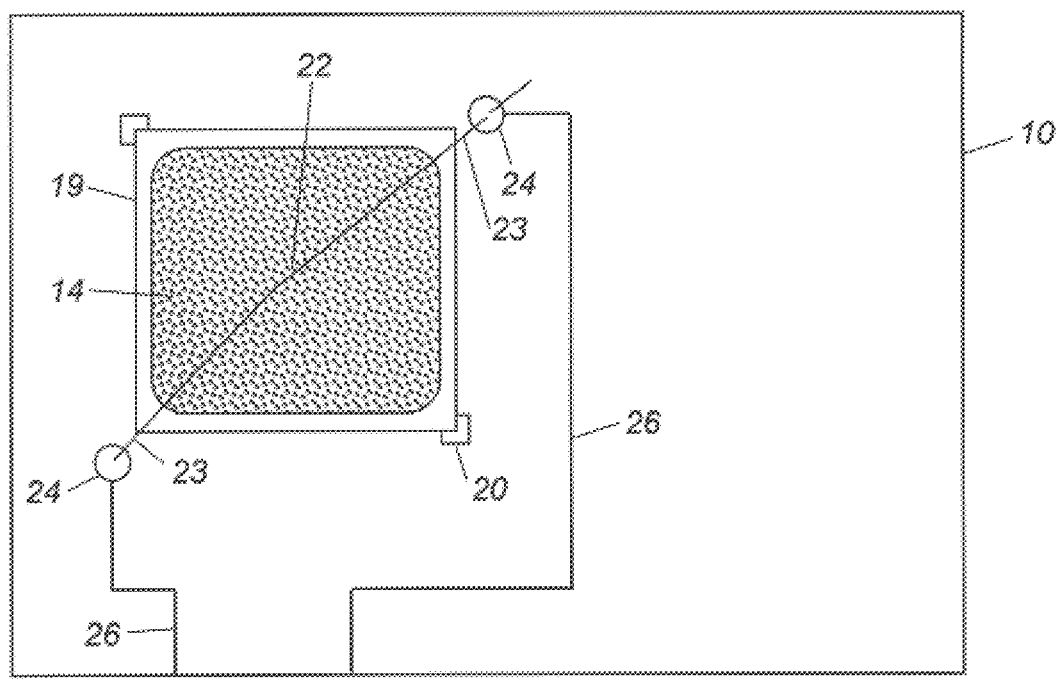
FIG. 5 illustrates a greatly enlarged top view of a thermocouple embedded in the adhesive bond, in accordance with the present invention.

To perform the re-attachment operation, a commercial rework station is used to apply internal heating to the interlayers 18, 19 in order to remove the electronic component 12 from the substrate 10. After de-soldering the electronic leads 16, shown in FIG. 1, from the substrate 10, the adhesive bond 14 is removed from the protrusions 20 of the interlayers 18, 19 with hot air and mechanical means. A low voltage electric current is introduced through the protrusions 20 of the interlayer 18 to internally heat the bonding material 16 between the electronic component 12 and the interlayer 18. The temperature of the bonding material 16 depends on the temperature of the interlayer 18 and may be monitored with a thermocouple 22, which may be embedded in the adhesive bond 14, as shown in FIG. 5.

After the sufficient heating period, the bonding material 16 starts to melt and the electronic component 12 is readily removed with a pick-up tool held by a human or robotic hand. The interlayer 19 is then removed from the substrate 10 in an additional step, by the same method. Later, the electronic component 12 is re-attached through the new sheets of the interlayers 18, 19 using the method described above. The method of the present invention thus does not require breaking of the adhesive bond 14 with the electronic component 12, which is difficult to accomplish and likely to damage the component 12, but involves detachment of the electronic component 12 from the interface 18 which is easily performed by the internal heating of the interface 18.

Figure 4:
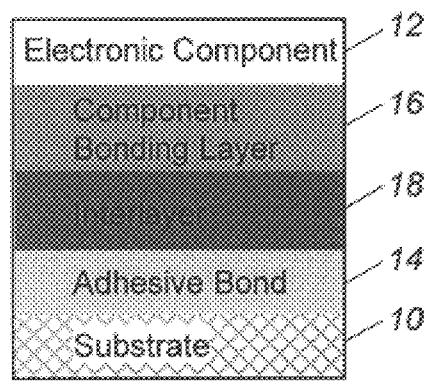
FIG. 4 illustrates a greatly enlarged cross-sectional view of a result of bonding via a single-layer interface, in accordance with the present invention.

If the substrate 10 is robust enough that the removal of the adhesive bond 14 from the substrate 10 can be made by mechanical means, there is no need for the interlayer 19 and bonding layer 21, and the substrate 10 may be directly attached to the adhesive bond 14. Referring to FIG. 4 in that case only a single metal sheet interlayer 18 is required between the electronic component 12 and the substrate 10 for safe removal of the electronic component 12, and the substrate 10 is directly bonded to the interlayer 18. FIG. 4 illustrates a greatly enlarged cross-sectional view of a result of bonding via a single-layer interface, in accordance with the present invention.

The interlayer 18, 19 material (FIG. 2) should match the electronic component 12 type, and it is preferable to use one of the high-resistance metal materials, such as: stainless steels, Ni—Fe low thermal expansion alloys including Kovar, refractory metals such as Mo, Nb, Ti and their alloys, or Ni and Ni-based alloys. For the bonding material 16 and bonding layer 21, for attaching the interlayers 18,19 to the electronic component 12 and the substrate 10, it is preferred to use the low melting temperature materials, such as metallic alloys with melting point less than 200° C. for metallic material, and thermal plastic hot-melt adhesives with flow point less than 200° C. for ceramic materials.

Additionally, the small, flexible thermocouple 22 may be embedded in the adhesive bond 14. FIG. 5 shows a top view of the thermocouple 22 embedded in the adhesive bond 14, before the electronic component 12 with its interlayer 18 is bonded with the adhesive bond 14. The embedded thermocouple 22 is insulated to prevent shorting to the metal sheet interlayers 18, 19. Thermocouple leads 23 may be soldered to the substrate 10 via through-holes 24, and become part of the wiring circuitry. The temperature measurement can be taken via test pins, not-shown, which may be build-in, and are inserted into the through-holes 24 which are attached to connection traces 26. The thermocouple 22 is preferably made as a pair of chrome and constantan (Type E), iron and constantan (Type J), copper and constantan (Type T), chrome and alumel (Type K), or any other two dissimilar materials that generate an electric signal due to a change in temperature.

The primary advantage of the present invention is the preservation of expensive electronic components while utilizing the established process for fabrication of PWB packages. It is especially profitable for attaching and reattaching MCM and other large area components, in military and commercial applications that require reworkable bonding, at high production yield and without any degradation of component capabilities. The replacement of electronic components can also be performed at customer site to provide fast, easy and inexpensive maintenance.

While this invention has been described with reference to its presently preferred embodiments, its scope is only limited insofar as defined by the following set of claims and all equivalents thereof. It is quite clear that the above description has been given purely by way of a non-restrictive example. Those skilled in the art will appreciate that various adaptations and modifications of the described preferred embodiments can be configured without departing from the scope and spirit of the invention. Therefore, it is to be understood that, within the scope of the appended claims, the invention may be practiced otherwise than as specifically described herein.

What is claimed is:

1. A method for attaching an electronic component onto a substrate to obtain a printed wiring board package for easy subsequent removal and reattachment of the electronic component without damage, comprising the steps of:

bonding a component interlayer onto the electronic component with a component bonding layer;

bonding a substrate interlayer onto the substrate with a substrate bonding layer;

forming an adhesive bond between the component interlayer and the substrate interlayer;

subsequently removing the component from the substrate; and re-attaching the component to the substrate.

2. The method of claim 1, wherein the component interlayer comprises a metal sheet with the coefficient of thermal expansion (CTE) which closely-matches the CTE of the electronic component, and having component interlayer protrusions for the internal heating of the component bonding layer for easy removal of the electronic component.

3. The method of claim 2, wherein the component interlayer comprises a high-resistance metal selected from the group consisting of stainless steels, Ni—Fe low thermal expansion alloys, refractory metals and their alloys, Ni and Ni-based alloys.

4. The method of claim 3, wherein the component bonding layer comprises a low melting temperature bonding material selected from the group comprised of low melting metallic alloy solders and thermal plastic adhesives with low flow points.

5. The method of claim 4, wherein the component bonding layer metallic alloy solders have a melting point of less than 200° C. and the thermal plastic adhesives have a flow point of less than 200° C.

6. The method of claim 4, wherein the adhesive bond comprises an epoxy adhesive having a good vibration damping and thermal conduction.

7. The method of claim 1, wherein the substrate interlayer comprises a metal sheet having a coefficient of thermal expansion (CTE) which closely-matches the CTE of the substrate, and having substrate interlayer protrusions for the internal heating of the substrate bonding layer.

8. The method of claim 7, wherein the substrate interlayer comprises a high-resistance metal selected from the group consisting of stainless steels, Ni—Fe low thermal expansion alloys, refractory metals and their alloys, Ni and Ni-based alloys.

9. The method of claim 8, wherein the substrate bonding layer includes a low melting temperature bonding material selected from the group comprised of low melting temperature metallic alloy solders and thermal plastic adhesives with low flow points.

10. The method of claim 9, wherein the substrate bonding layer metallic alloy solders having a melting point of less than 200° C. and the thermal plastic adhesives having a flow point of less than 200° C.

11. The method of claim 9, wherein the adhesive bond further comprises a thermocouple embedded in the adhesive bond for measuring temperature of the component and substrate bonding layers, said thermocouple comprising a pair of dissimilar materials configured to generate an electric signal in response to a change in temperature, said materials selected from the group comprising pairs of chrome and constantan (Type E), iron and constantan (Type J), copper and constantan (Type T), and chrome and alumel (Type K).

12. The method of claim 6, wherein the adhesive bond further comprises a thermocouple embedded in the adhesive bond for detecting melting of the component bonding layer, said thermocouple comprising a pair of dissimilar materials for generating an electric signal due to a change in temperature, said materials selected from the group comprising chrome and constantan (Type E), iron and constantan (Type J), copper and constantan (Type T), and chrome and alumel (Type K).

13. A method for attaching and re-attaching an electronic component onto a substrate to repair a printed wiring board package, comprising the steps of:

(a) bonding the electronic component to a component interlayer with a component bonding layer having a first adhesive material;

(b) bonding the substrate to a substrate interlayer with a substrate bonding layer having a second adhesive material;

(c) bonding the component interlayer to the substrate bonding layer with an adhesive bond using a third different adhesive material;

(d) removing the electronic component from the component interlayer by heating the component interlayer;

(e) removing the substrate interlayer from the substrate; and (f) repeating steps (a) through (c) for re-attaching an electronic component onto the substrate via a component interlayer;

whereby the component can be easily removed and re-attached without damage.

14. The method of claim 13, wherein the component interlayer comprises a metal sheet with a coefficient of thermal expansion (CTE) which closely-matches the CTE of the electronic component, and wherein the component interlayer includes protrusions for the internal heating of the component bonding layer for easy removal of the electronic component.

15. The method of claim 14, wherein the component interlayer comprises a high-resistance metal selected from the group consisting of stainless steels, Ni—Fe low thermal expansion alloys, refractory metals and their alloys, Ni and Ni-based alloys.

16. The method of claim 15, wherein the component bonding layer comprises a low melting temperature bonding material selected from the group comprising of low melting metallic alloy solders and thermal plastic adhesives with low flow point.

17. The method of claim 16, wherein the component bonding layer metallic alloy solders having the melting point of less than 200° C. and the thermal plastic adhesives having the flow point of less than 200° C.

18. The method of claim 16, wherein the adhesive bond comprises an epoxy adhesive having a good vibration damping and thermal conduction.

19. The method of claim 18, wherein the adhesive bond further comprises a thermocouple embedded in the adhesive bond for detecting melting of the component bonding layer, said thermocouple comprising a pair of dissimilar materials for generating an electric signal due to a change in temperature, said materials selected from the group comprising pairs of chrome and constantan (Type E), iron and constantan (Type J), copper and constantan (Type T), and chrome and alumel (Type K).

20. The method of claim 18, wherein the step (c) of removing the electronic component from the substrate by heating the component interlayer comprises the steps of:

introducing an electric current to the component interlayer protrusions for heating the component interlayer and the component bonding layers;

monitoring the temperature of the component bonding layer; and removing the electronic component from the component interlayer when the component bonding layer starts melting.

21. The method of claim 13, wherein the substrate interlayer comprises a metal sheet with the coefficient of thermal expansion (CTE) which closely-matches the CTE of the substrate, and having substrate interlayer protrusions for the internal heating of the substrate bonding layer for easy removal of the substrate.

22. The method of claim 21, wherein the substrate interlayer comprises a high-resistance metal selected from the group consisting of stainless steels, Ni—Fe low thermal expansion alloys, refractory metals and their alloys, Ni and Ni-based alloys.

23. The method of claim 22, wherein the substrate bonding layer comprises a low melting temperature bonding material selected from the group comprising of low melting metallic alloy solders and thermal plastic adhesives with low flow point.

24. The method of claim 23, wherein the substrate bonding layer metallic alloy solders having the melting point of less than 200° C. and the thermal plastic adhesives having the flow point of less than 200° C.

25. The method of claim 23, wherein the adhesive bond further comprises a thermocouple embedded in the adhesive bond for detecting melting of the component and substrate bonding layers, said thermocouple comprising a pair of dissimilar materials for generating an electric signal due to a change in temperature, said materials selected from the group comprising pairs of chrome and constantan (Type E), iron and constantan (Type J), copper and constantan (Type T), and chrome and alumel (Type K).

26. The method of claim 25, wherein the step (c) of removing the electronic component from the substrate further comprises the steps:

introducing an electric current to the substrate interlayer protrusions for heating the substrate interlayer and the substrate bonding layer;

monitoring the temperature of the substrate bonding layer; and removing the substrate interlayer from the substrate when the substrate bonding layer starts melting.

* * * * *